(12) United States Patent
Tabuchi

(10) Patent No.: US 8,937,480 B2
(45) Date of Patent: Jan. 20, 2015

(54) HIGH FREQUENCY DETECTION DEVICE AND COAXIAL CABLE INCLUDING THE SAME

(75) Inventor: Isao Tabuchi, Osaka (JP)

(73) Assignee: Daihen Corporation, Osaka (JP)

( * ) Notice: Subject to any disclaimer, the term of this patent is extended or adjusted under 35 U.S.C. 154(b) by 565 days.

(21) Appl. No.: 13/185,060

(22) Filed: Jul. 18, 2011

(65) Prior Publication Data

US 2012/0019267 A1    Jan. 26, 2012

(30) Foreign Application Priority Data

Jul. 21, 2010   (JP) ................................ 2010-163667

(51) Int. Cl.
| | | |
|---|---|---|
| G01R 27/26 | (2006.01) | |
| G01R 15/18 | (2006.01) | |
| H01B 11/00 | (2006.01) | |
| H01L 27/00 | (2006.01) | |
| H01Q 1/00 | (2006.01) | |
| H01Q 1/38 | (2006.01) | |
| H01Q 7/00 | (2006.01) | |
| H01R 9/00 | (2006.01) | |
| H05H 1/00 | (2006.01) | |
| H01F 5/00 | (2006.01) | |
| H01F 27/28 | (2006.01) | |
| H05K 1/16 | (2006.01) | |

(52) U.S. Cl.
CPC ................ *G01R 15/18* (2013.01); *H01B 11/00* (2013.01); *H01L 27/00* (2013.01); *H01Q 1/00* (2013.01); *H01Q 1/38* (2013.01); *H01Q 7/00* (2013.01); *H01R 9/00* (2013.01); *H05H 1/0081* (2013.01); *H01F 5/003* (2013.01); *H01F 27/2804* (2013.01); *H05K 1/162* (2013.01); *H05K 1/165* (2013.01); *H05K 2201/097* (2013.01); *H05K 2201/09809* (2013.01); *H05K 2201/10015* (2013.01); *H05K 2201/10151* (2013.01)
USPC ........................................................ 324/686

(58) Field of Classification Search
None
See application file for complete search history.

(56) References Cited

U.S. PATENT DOCUMENTS

| 5,317,267 A | 5/1994 | Miyata et al. |
|---|---|---|
| 5,477,148 A | 12/1995 | Miyata et al. |
| 5,554,930 A | 9/1996 | Miyata et al. |
| 8,179,122 B2 * | 5/2012 | Ibuki .............................. 324/127 |
| 2009/0058398 A1 | 3/2009 | Ibuki |

FOREIGN PATENT DOCUMENTS

| JP | 4-314969 | 11/1992 |
|---|---|---|
| JP | 2009-36553 | 2/2009 |
| JP | 2009-58449 | 3/2009 |

* cited by examiner

*Primary Examiner* — Paresh Patel
(74) *Attorney, Agent, or Firm* — Hamre, Schumann, Mueller & Larson, P.C.

(57) ABSTRACT

The present invention provides a high frequency detection device that detects a high frequency voltage signal according to a high frequency voltage generated in a power transmission body. The high frequency detection device includes a substrate and a capacitance conductor fixed to the substrate. The capacitance conductor includes a penetration portion and a capacitor electrode. In the penetration portion, the power transmission body is disposed so as to extend along the penetration portion in a state in which the axial direction of the power transmission body and the substrate are substantially orthogonal. The capacitor electrode is provided to be opposed to the power transmission body.

13 Claims, 9 Drawing Sheets

HIGH FREQUENCY DETECTION DEVICE AND COAXIAL CABLE INCLUDING THE SAME

BACKGROUND OF THE INVENTION

1. Field of the Invention

The present invention relates to a high frequency detection device that detects a high frequency signal of high frequency power transmitted through a coaxial line. The present invention particularly relates to a coaxial cable including such a high frequency detection device.

2. Description of Related Art

A plasma processing system has heretofore been developed in which high frequency power is supplied to a plasma processing apparatus so as to process a workpiece such as a semiconductor wafer or a liquid crystal substrate.

FIG. 12 is a block diagram showing the configuration of a generally used plasma processing system. The impedance of a plasma processing apparatus 300 varies during plasma processing. Accordingly, the reflected wave power reflected at an input terminal of the plasma processing apparatus 300 may cause damage to a high frequency power source apparatus 100. To address this, an impedance matching apparatus 200 is provided between the high frequency power source apparatus 100 and the plasma processing apparatus 300 so that the impedance matching apparatus 200 can perform a matching operation according to the impedance variation of the plasma processing apparatus 300.

The system described above needs to monitor the impedance of the plasma processing apparatus 300 during plasma processing, as well as a high frequency voltage and a high frequency current at the input terminal of the plasma processing apparatus 300. Monitoring of the plasma processing apparatus 300 is performed using various types of high frequency parameters measured by a high frequency measurement apparatus 500 disposed on a transmission line 400 connecting the impedance matching apparatus 200 and the plasma processing apparatus 300 at a position close to the plasma processing apparatus 300. A conventional current/voltage detector is disclosed in JP 2009-36553A or JP 2009-58449A.

The high frequency measurement apparatus 500 detects a high frequency voltage signal and a high frequency current signal, and determines a phase difference θ between high frequency voltage and high frequency current from the detected signals. The high frequency measurement apparatus 500 also calculates high frequency parameters including a voltage effective value V, a current effective value I, an impedance Z=R+jX (corresponding to the impedance of the plasma processing apparatus 300 because the measurement point is near the input terminal of the plasma processing apparatus 300), a reflection coefficient Γ, a traveling wave power Pf input into the plasma processing apparatus 300, a reflected wave power Pr reflected at the input terminal of the plasma processing apparatus 300 due to impedance mismatch, and the like.

The high frequency measurement apparatus 500 includes a high frequency detection device 510 that is disposed on the transmission line 400 and detects a high frequency voltage signal and a high frequency current signal, and a computing unit 520 that calculates various types of high frequency parameters through computation from the high frequency voltage signal and the high frequency current signal that have been detected by the high frequency detection device 510.

FIG. 13 is a diagram illustrating a general internal configuration of the high frequency detection device 510. As shown in FIG. 13, the high frequency detection device 510 includes a power transmission body 511, a current transformer portion 512, a current conversion circuit 513, a capacitor portion 514, and a voltage conversion circuit 515.

The power transmission body 511 is connected to an inner conductor of the transmission line 400 and transmits the high frequency power output by the high frequency power source apparatus 100. The power transmission body 511 can be, for example, a conductor such as a cylindrical rod made of copper, and its outer surface is covered with an insulator. The current transformer portion 512 detects a current according to the high frequency current flowing thorough the power transmission body 511 and outputs the detected current to the current conversion circuit 513. The current conversion circuit 513 converts the input current to a high frequency current signal, which is a predetermined voltage level signal, and outputs the signal to the computing unit 520. The capacitor portion 514 detects a voltage according to the high frequency voltage generated in the power transmission body 511 and outputs the detected voltage to the voltage conversion circuit 515. The voltage conversion circuit 515 converts the input voltage to a high frequency voltage signal, which is a predetermined voltage level signal, and outputs the signal to the computing unit 520. The computing unit 520 receives input of the high frequency current signal and the high frequency voltage signal from the high frequency detection device 510, calculates various types of high frequency parameters through computation, and outputs the parameters.

If there are variations in the shapes of the current transformer for current detection, the capacitor for voltage detection and wires, variations will occur in the detected values output from the high frequency detection device 510. In order to suppress such variations, technology has been developed for forming the current transformer, the capacitor and wires on a printed circuit board in the form of printed wiring.

FIG. 14 is a diagram illustrating a high frequency detection device 510 that uses a printed circuit board in which the current transformer, the capacitor and wires have been formed in the form of printed wiring. As shown in FIG. 14, the high frequency detection device 510 includes the power transmission body 511, a current detection printed circuit board 516, a voltage detection printed circuit board 517, and a housing 518.

The current detection printed circuit board 516 is a printed circuit board in which the current transformer portion 512 and the current conversion circuit 513 included in the internal configuration of the high frequency detection device 510 shown in FIG. 13 and a wire for outputting the current detected by the current transformer portion 512 to the current conversion circuit 513 have been formed. Likewise, the voltage detection printed circuit board 517 is a printed circuit board in which the capacitor portion 514 and the voltage conversion circuit 515 included in the internal configuration of the high frequency detection device 510 and a wire for outputting the voltage detected by the capacitor portion 514 to the voltage conversion circuit 515 have been formed. The housing 518 fixes the current detection printed circuit board 516 and the voltage detection printed circuit board 517, and protects the substrates 516 and 517 from external electromagnetic waves and the like. The housing 518 can be made of, for example, a conductor such as aluminum.

FIGS. 15(a) to 15(c) are diagrams illustrating an example of the voltage detection printed circuit board 517. As shown in FIG. 15(a), in the voltage detection printed circuit board 517, the voltage conversion circuit 515 is mounted on a substrate, and predetermined printed wiring is formed. Also, the substrate has a penetration hole formed therein, and the power transmission body 511 (see FIGS. 13 and 14) is disposed in the penetration hole. A ring-shaped wiring 514a constitutes the capacitor portion 514 (see FIG. 13) between the ring-shaped wiring 514a and the power transmission body 511, and is ring-shaped wiring formed along the periphery of the penetration hole. FIGS. 15(b) and 15(c) are diagrams illustrating the ring-shaped wiring 514a. FIG. 15(b) is an enlarged view of a region surrounded by a broken line and indicated by c in FIG. 15(a), and FIG. 15(c) is a cross-sectional view taken along the line D-D' in FIG. 15(b). As shown in FIGS. 15(b) and 15(c), the ring-shaped wiring 514a is formed by through holes passing through the substrate and printed wiring connecting the through holes. Generally, a through hole refers to a connecting means in which a conductor layer (for example, copper) is provided inside a penetration hole formed in a substrate. Such a through hole includes a type for insertion of a lead wire of an electronic component and a type intended only for establishing an electrical connection between the surface and the back surface of a substrate. The latter type of through hole is particularly called a "via hole". The via hole includes a through type (through via) that extends from the surface to the back surface of a substrate and an interstitial via hole that extends only partially through a multi-layer substrate. Furthermore, the interstitial via hole includes a blind via through which the hole can be seen from one side of a substrate and a buried via that has been completely buried in a substrate. In this specification, the term "through hole" is used to mean both "through via" and "interstitial via hole".

The voltage conversion circuit 515 includes a capacitor C2 connected in series to the capacitor portion 514 (hereinafter also referred to as the "capacitor C1" depending on the case) and a resistor R1 connected to a connection point between the capacitor C1 and the capacitor C2. The voltage detection printed circuit board 517 divides the high frequency voltage generated by the power transmission body 511 disposed so as to pass through the penetration hole between the capacitor C1 and the capacitor C2, adjusts the voltage level of the divided voltage generated at the connection point between the capacitor C1 and the capacitor C2 using the resistor R1, and outputs the resultant as a high frequency voltage signal.

In the high frequency detection device 510 shown in FIG. 14, the current transformer portion 512, the capacitor portion 514 and wires are formed on a printed circuit board in the form of printed wiring, and it is therefore possible to suppress a situation in which variations occur in the shapes of the current transformer portion 512, the capacitor portion 514 and the wires. Accordingly, it is possible to suppress a situation in which variations occur in the values detected by the high frequency detection device 510.

There is, however, a problem in that the electrostatic capacity of the capacitor C1 formed by the ring-shaped wiring 514a of the voltage detection printed circuit board 517 is limited. Specifically, the electrostatic capacity of the capacitor C1 is proportional to the length of the through hole of the ring-shaped wiring 514a, or in other words, the thickness of the voltage detection printed circuit board 517, but because the thickness of the voltage detection printed circuit board 517 cannot be increased due to cost and technical reasons, it is difficult to increase the electrostatic capacity of the capacitor C1.

For example, the high frequency voltage generated in the power transmission body 511 can reach approximately several thousand volts because high voltage is used in plasma processing. The high frequency voltage signal output by the voltage conversion circuit 515 is input into the computing unit 520, and thus it is necessary to adjust the voltage level of the high frequency voltage signal output by the voltage conversion circuit 515 to approximately several volts. In other words, it is necessary to cause the voltage conversion circuit 515 to attenuate the high frequency voltage generated in the power transmission body 511 by a factor of approximately 1000 before outputting the signal. Accordingly, it is necessary to reduce an electrostatic capacity $C_1$ of the capacitor C1 to approximately 1/1000 of an electrostatic capacity $C_2$ of the capacitor C2. The voltage conversion circuit 515 can thereby attenuate the voltage level of the divided voltage generated at the connection point between the capacitor C1 and the capacitor C2 to approximately 1/1000 of the high frequency voltage generated in the power transmission body 511 and output the signal.

Too large a combined electrostatic capacity of the capacitor C1 and the capacitor C2 is not preferable because a current branching to the capacitor C1 of the high frequency current flowing through the power transmission body 511 will be large. Conversely, if the combined electrostatic capacity is too small, the current branching to the capacitor C1 will be too small, lowering the detection accuracy of the high frequency voltage signal. Accordingly, it is necessary to design the combined electrostatic capacity of the capacitor C1 and the capacitor C2 such that the current branching to the capacitor C1 falls within a predetermined range.

As described above, it is necessary to design the electrostatic capacities $C_1$ and $C_2$ of the capacitor C1 and the capacitor C2 taking the attenuation factor and the combined electrostatic capacity into consideration. For example, the electrostatic capacity $C_1$ of the capacitor C1 is set to approximately 0.5 to 1 pF, and the electrostatic capacity $C_2$ of the capacitor C2 is set to approximately 500 to 1000 pF. Also, the computing unit 520 usually includes a voltage follower circuit (whose input impedance is high) provided at an input terminal thereof, and thus hardly any current flows to the resistor R1 for adjustment. A current may, of course, flow depending on the design of the computing unit 520. For example, in the case where a resistor is provided at an input terminal of the computing unit 520 between the input terminal of the computing unit 520 and the ground potential, some current flows to the resistor R1 as well. Accordingly, adjustment by the resistor R1 becomes possible.

The electrostatic capacity C1 of the capacitor C1 can be calculated by the following equation:

$$C_1 = 2\pi \in \cdot l / (\ln(b/a)) \qquad (1),$$

where the outer diameter of the power transmission body 511 is indicated by a, the inner diameter of the ring-shaped wiring 514a is indicated by b (see FIG. 15(a), and the height of the ring-shaped wiring 514a (the length of the through hole; see FIG. 15(c)) is indicated by l.

Note that $\pi$ indicates the circumference ratio, $\in$ indicates the dielectric constant, and ln indicates the natural logarithm. The ring-shaped wiring 514a has a gap between through holes, and thus the actual electrostatic capacity will be smaller than the electrostatic capacity $C_1$ calculated using the Equation (1) given above.

The high frequency voltage generated in the power transmission body 511 is high, and thus a dielectric breakdown will occur if the distance between the power transmission body 511 and the ring-shaped wiring 514a is small. In order to avoid the dielectric breakdown and to be safe, it is desirable to design the distance between the power transmission body 511 and the ring-shaped wiring 514a to have leeway. For example, it is desirable to set the distance to 20 mm or greater (the required distance varies depending on the use conditions). In the case where the outer diameter a of the power transmission body 511 is 20 mm, for example, in order to set the distance between the power transmission body 511 and the ring-shaped wiring 514a to 20 mm, the inner diameter b of the ring-shaped wiring 514a is required to be set to 60 mm. In this case, in order to obtain an electrostatic capacity $C_1$ of the capacitor C1 of 0.5 pF, from the Equation (1) given above, the height l of the ring-shaped wiring 514a is required to set be to about 9.9 mm. Also, if the distance between the power transmission body 511 and the ring-shaped wiring 514a is set to a value greater than 20 mm, the height l of the ring-shaped wiring 514a is required to be set to an even greater value.

If the distance between the power transmission body 511 and the ring-shaped wiring 514a is reduced, the height l of the ring-shaped wiring 514a can be reduced. However, for example, when the outer diameter a of the power transmission body 511 is 20 mm and the distance between the power transmission body 511 and the ring-shaped wiring 514a is 10 mm, in order to obtain an electrostatic capacity $C_1$ of the capacitor C1 of 0.5 pF, from the Equation (1) given above, the height l of the ring-shaped wiring 514a is required to be set to about 6.2 mm. Also, in the case of increasing the electrostatic capacity $C_1$ of the capacitor C1 to a value greater than 0.5 pF, the height l of the ring-shaped wiring 514a is required to be set to an even greater value.

When consideration is given to the reduction of the electrostatic capacity due to the gap between through holes, the height l of the ring-shaped wiring 514a is set to an even grater value. However, the voltage detection printed circuit board 517 can currently have a maximum thickness of approximately 5 mm. Accordingly, it is not possible to obtain a desired electrostatic capacity of the capacitor C1 depending on the use conditions.

SUMMARY OF THE INVENTION

The present invention has been proposed under the circumstances described above, and it is an object of the present invention to provide a high frequency detection device in which the electrostatic capacity of a capacitor formed between a capacitance conductor and a power transmission body is not limited by the thickness of a substrate.

According to a first aspect of the present invention, a high frequency detection device that detects a high frequency voltage signal according to a high frequency voltage generated in a power transmission body is provided. The high frequency detection device includes a substrate, and a capacitance conductor that is fixed to the substrate and includes a penetration portion and a capacitor electrode, the capacitor electrode configured to be opposed to the power transmission body when the power transmission body extends along the penetration portion in a state in which an axial direction of the power transmission body and the substrate are substantially orthogonal.

According to a second aspect of the present invention, the high frequency detection device according to the first aspect of the present invention further includes a voltage converter including a voltage divider element connected in series to the capacitance conductor. The voltage converter is configured to output a high frequency voltage signal obtained by attenuating the high frequency voltage generated in the power transmission body to a predetermined voltage level.

According to a third aspect of the present invention, in the high frequency detection device according to the second aspect of the present invention, the voltage divider element includes a capacitor or a resistor.

According to a fourth aspect of the present invention, in the high frequency detection device according to any one of the first to third aspects of the present invention, the capacitance conductor has a ring shape.

According to a fifth aspect of the present invention, in the high frequency detection device according to any one of the first to fourth aspects of the present invention, the substrate has a penetration hole formed therein, and the capacitance conductor is inserted into and fixed to the penetration hole.

According to a sixth aspect of the present invention, the high frequency detection device according to any one of the first to fifth aspects of the present invention further includes further includes coiled wiring and a current converter. The coiled wiring is formed along a perimeter of the capacitance conductor on the substrate. The current converter is configured to output a high frequency current signal, which is a predetermined voltage level signal, based on a current flowing through the coiled wiring according to a high frequency current flowing through the power transmission body disposed so as to pass through the capacitance conductor.

According to a seventh aspect of the present invention, the high frequency detection device according to the sixth aspect of the present invention further includes a shielding portion provided between the coiled wiring and the capacitance conductor on the substrate. The shielding portion is configured to reduce an influence of an electric field generated around the power transmission body on the coiled wiring while causing a magnetic flux generated by the current flowing through the power transmission body to act on the coiled wiring.

According to an eighth aspect of the present invention, the high frequency detection device according to any one of the first to seventh aspects of the present invention is used in a coaxial cable including an inner conductor and an outer conductor. The power transmission body is the inner conductor, and the substrate is fixed inside the outer conductor.

According to a ninth aspect of the present invention, in the high frequency detection device according to the eighth aspect of the present invention, the substrate has a circular shape.

According to a tenth aspect of the present invention, the high frequency detection device according to the eighth or ninth aspect of the present invention further includes a protector for protecting wiring on the substrate or a circuit mounted on the substrate from an electromagnetic wave generated by high frequency power transmitted through the power transmission body.

According to an eleventh aspect of the present invention, in the high frequency detection device according to the tenth aspect of the present invention, the protector includes two protective substrates provided so as to sandwich the substrate in the axial direction of the power transmission body.

According to a twelfth aspect of the present invention, a coaxial cable including an elongated inner power transmission body, an outer conductor surrounding the inner power transmission body, and a high frequency detection device that detects a high frequency voltage signal according to a high frequency voltage generated in the inner power transmission body is provided. The high frequency detection device includes a substrate fixed inside the outer conductor and a capacitance conductor that is fixed to the substrate and includes a penetration portion and a capacitor electrode, and the capacitor electrode is configured to be opposed to the inner power transmission body when the inner power transmission body extends along the penetration portion in a state in which an axial direction of the inner power transmission body and the substrate are substantially orthogonal.

According to the present invention, the capacitance conductor is fixed to the substrate, and thus a capacitor is formed between the capacitance conductor and the power transmission body when the power transmission body is disposed so as to pass through the penetration portion of the capacitance conductor. The high frequency voltage generated in the power transmission body can be output via wiring or the like connected to the capacitance conductor. The thickness of the capacitance conductor (a dimension of the power transmission body as viewed in the axial direction thereof) can be made greater than the thickness of the substrate, and thus the electrostatic capacity of the capacitor formed between the capacitance conductor and the power transmission body can be increased regardless of the thickness of the substrate. In other words, the electrostatic capacity is not limited by the thickness of the substrate.

Also, in the case where the substrate is fixed inside the outer conductor of the coaxial cable, because the inner conductor is coaxially fixed to the outer conductor, and the capacitance conductor is fixed to the substrate, the relative position of the capacitance conductor with respect to the inner conductor is fixed. Consequently, the situation in which the relative position of the capacitance conductor with respect to the inner conductor changes or becomes unstable can be suppressed, and it is thereby possible to suppress the occurrence of variations in the detected values.

Other features and advantages of the present invention will be more apparent from the following detailed description of the invention with reference to the accompanying drawings.

DETAILED DESCRIPTION OF THE PREFERRED EMBODIMENTS

Embodiments of the present invention will be described below with reference to the accompanying drawings, taking a high frequency detection device disposed partway along a coaxial cable as an example.

Figure 1:
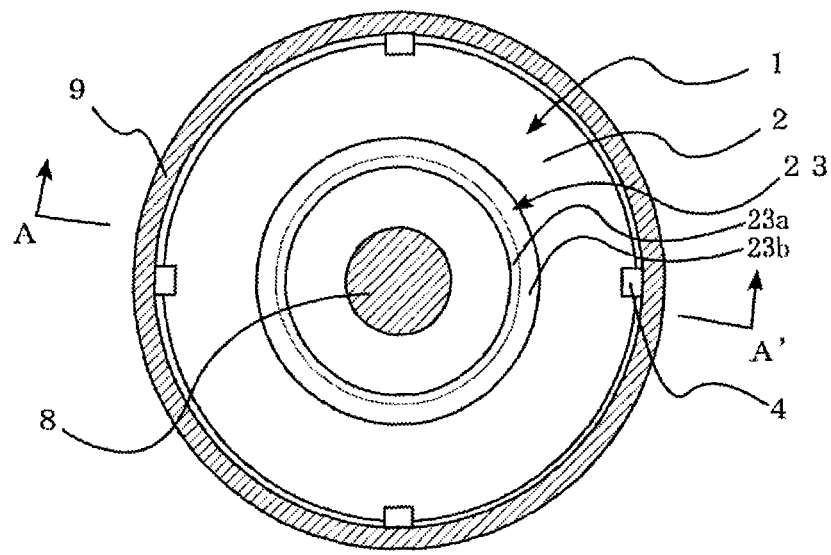
FIG. 1 is a diagram illustrating the configuration of a high frequency detection device according to a first embodiment of the present invention, showing the high frequency detection device disposed in a coaxial cable as viewed in the axial direction of the coaxial cable.
Figure 2:
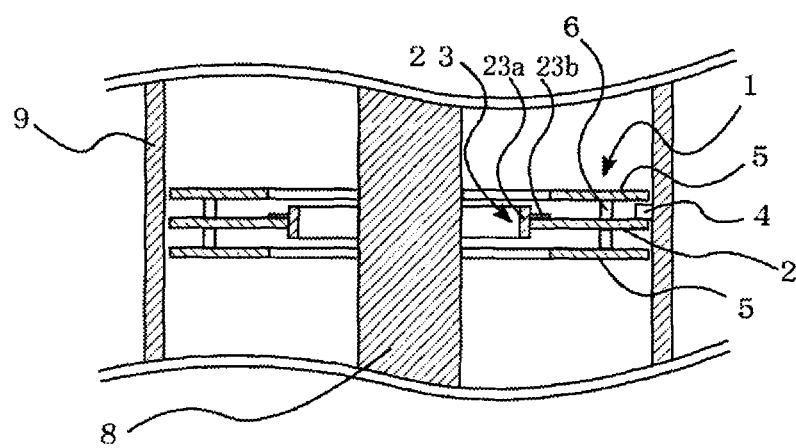
FIG. 2 is a diagram illustrating the configuration of the high frequency detection device according to the first embodiment, showing the high frequency detection device disposed in the coaxial cable as viewed in the radial direction of the coaxial cable.
Figure 12:
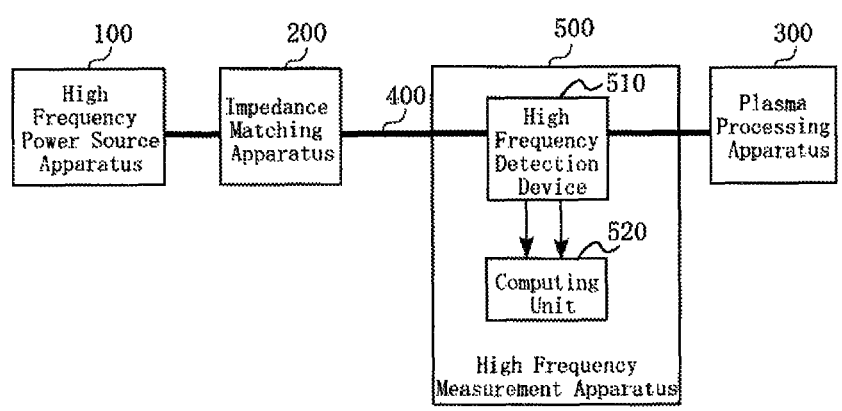
FIG. 12 is a block diagram showing the configuration of a generally used plasma processing system.
Figure 13:
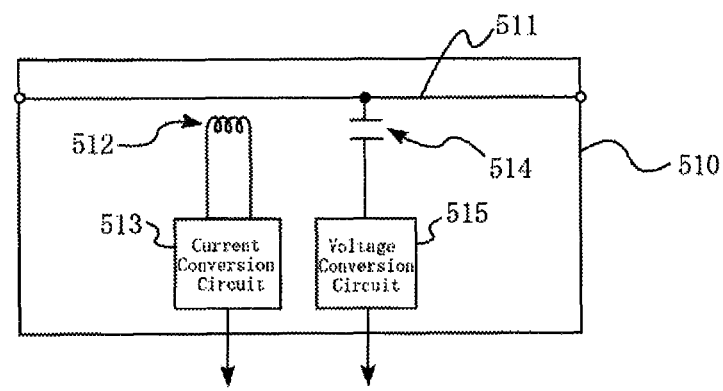
FIG. 13 is a diagram illustrating the general internal configuration of a high frequency detection device.

FIGS. 1 and 2 are diagrams illustrating the configuration of a high frequency detection device 1 according to a first embodiment of the present invention, which show the high frequency detection device 1 that has been disposed in a coaxial cable. The coaxial cable is a path for transmission of high frequency power, and includes an inner conductor 8 and an outer conductor 9. The high frequency detection device 1 is disposed in a space between the inner conductor 8 and the outer conductor 9 of the coaxial cable, and detects a high frequency voltage signal and a high frequency current signal of the high frequency power transmitted through the coaxial cable. The outer conductor 9 is grounded to a potential of 0 volts (reference potential), and thus the high frequency detection device 1 substantially detects a high frequency voltage signal and a high frequency current signal of the high frequency power transmitted through the inner conductor 8. The high frequency voltage signal and the high frequency current signal that have been detected by the high frequency detection device 1 are output to a computing unit (not shown in FIGS. 1 and 2, see FIG. 12), and the computing unit calculates various types of high frequency parameters through computation from the input high frequency voltage signal and high frequency current signal.

FIG. 1 is a cross-sectional view of the high frequency detection device 1 disposed in the coaxial cable as viewed in the axial direction of the coaxial cable. FIG. 2 is a cross-sectional view taken along the line A-A' in FIG. 1, showing the high frequency detection device 1 disposed in the coaxial cable as viewed in the radial direction of the coaxial cable.

As shown in FIGS. 1 and 2, the high frequency detection device 1 includes a printed circuit board 2, a fastener 4, a protective substrate 5, and a fastener 6. The protective substrate 5 is not shown in FIG. 1.

The printed circuit board 2 is a substrate in which a circuit for detecting the high frequency voltage signal and the high frequency current signal has been formed, and implements a substantial function (function of detecting the high frequency voltage signal and the high frequency current signal) of the high frequency detection device 1. In the printed circuit board 2, a current transformer, a capacitor, a current conversion circuit, a voltage conversion circuit, wires have been formed.

The printed circuit board 2 will be described in detail below with reference to FIGS. 3 to 5.

Figure 3:
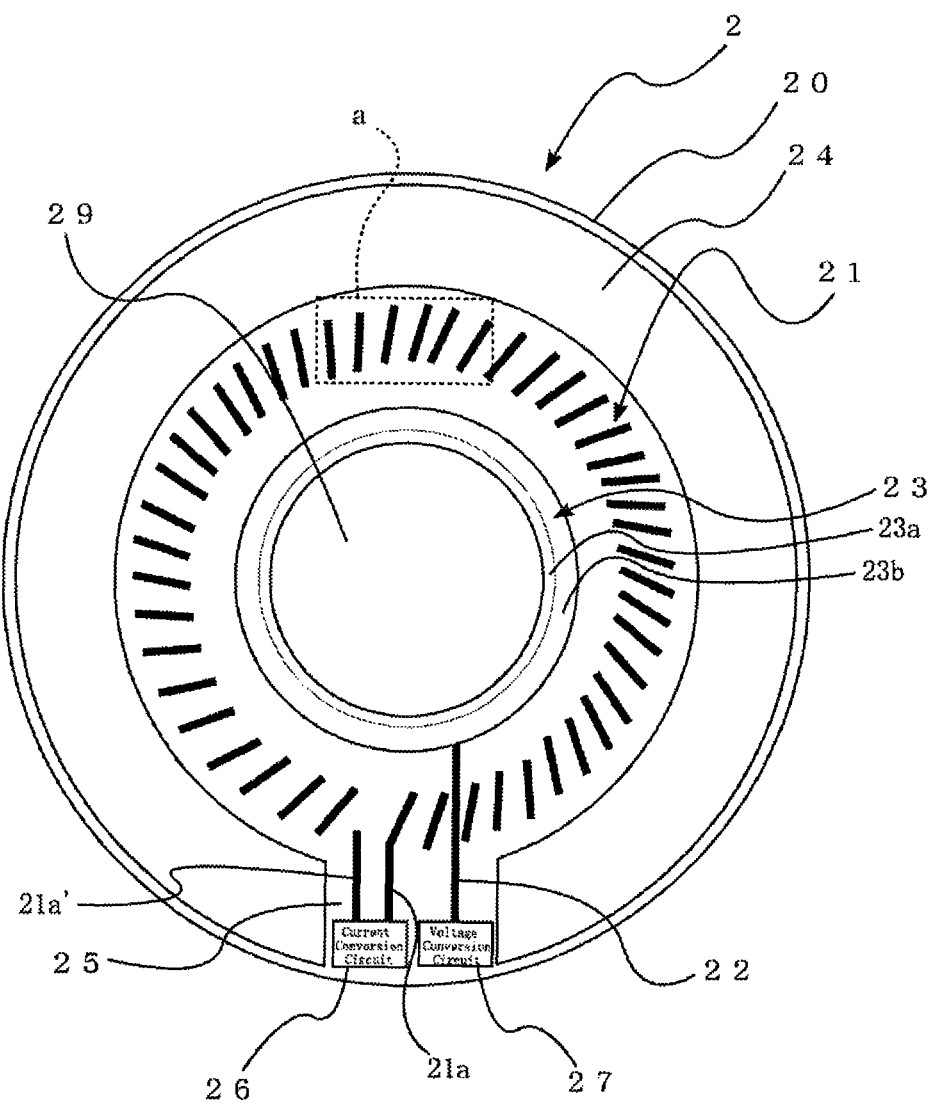
FIG. 3 is a plan view illustrating a printed circuit board according to the first embodiment.
Figure 4:
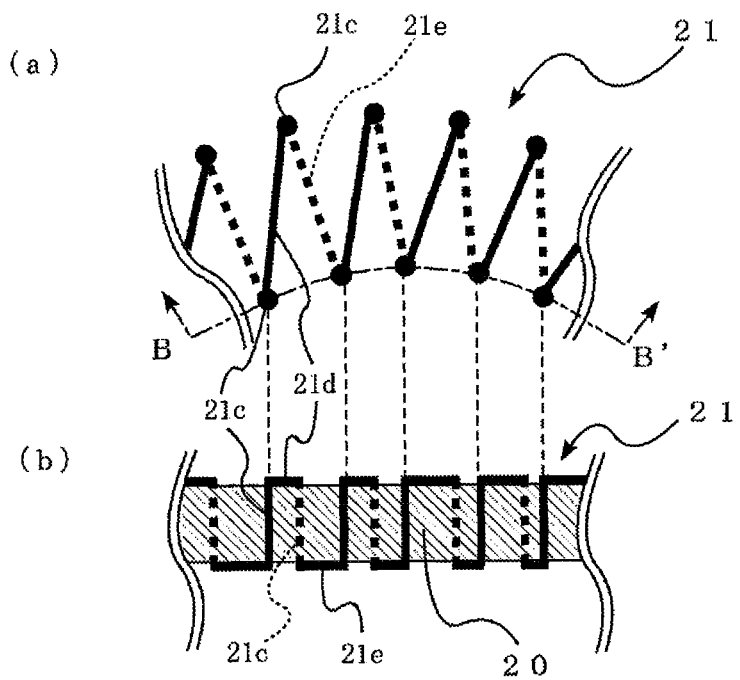
FIGS. 4(a) and 4(b) are diagrams illustrating coiled wiring.

FIG. 3 is a plan view illustrating the printed circuit board 2. Hereinafter, the mounting surface shown in FIG. 3 will be referred to as the "surface", and the other mounting surface will be referred to as the "back surface".

As shown in FIG. 3, the printed circuit board 2 includes coiled wiring 21, a ring connection wire (output wire) 22, a closed annular capacitance conductor 23, ground wiring 24, a circuit mounting portion 25, a current conversion circuit 26, and a voltage conversion circuit 27 that are provided on a circular substrate 20 having a penetration hole 29 formed in the center of the substrate 20.

The substrate 20 is made of, for example, an insulating material such as glass epoxy, and is a circular substrate having a diameter less than or equal to the inner diameter of the outer conductor 9. In the present embodiment, the substrate 20 is configured to have a diameter slightly smaller than the inner diameter of the outer conductor 9 so that a small space is created between the substrate 20 and the inner wall of the outer conductor 9 and the substrate 20 can be easily fixed to the inner wall of the outer conductor 9. The configuration is not limited thereto as long as the substrate 20 can be fixed to the inner wall of the outer conductor 9, and the radius of the substrate 20 may be reduced so as not to make the mounting surface too small. Also, the shape of the substrate 20 is not limited to a circular shape, and the substrate 20 may have any other shape (for example, a polygonal shape such as a rectangular or octagonal shape, or an elliptic shape) as long as the substrate 20 can be fixed to the inner wall of the outer conductor 9.

The penetration hole 29 is a hole that has been formed so as to pass through the center of the substrate 20 and that has a diameter greater than or equal to the outer diameter of the inner conductor 8. In the present embodiment, the penetration hole 29 is configured to have a diameter greater than the outer diameter of the inner conductor 8 in order to create a space for disposing the capacitance conductor 23 between the penetration hole 29 and the inner conductor 8. The shape of the penetration hole 29 is not limited to a circular shape, and may have any other shape (for example, a polygonal shape such as a rectangular or octagonal shape, or an elliptic shape) as long as the inner conductor 8 and the capacitance conductor 23 can be inserted.

The coiled wiring 21 is printed wiring formed in the periphery of the penetration hole 29 of the substrate 20 in the shape of a coil, and functions as a current transformer. The coiled wiring 21 has, at both ends thereof, output wires 21a and 21a' extending toward the circuit mounting portion 25. The output wires 21a and 21a' are connected to the current conversion circuit 26, which will be described later, in the circuit mounting portion 25.

FIGS. 4(a) and 4(b) are diagrams illustrating the coiled wiring 21. FIG. 4(a) is an enlarged view of a region surrounded by a broken line and indicated by a in FIG. 3, and FIG. 4(b) is a cross-sectional view taken along the line B-B' in FIG. 4(a). In FIGS. 4(a) and 4(b), normally invisible printed wires are indicated by broken lines.

As shown in FIGS. 4(a) and 4(b), the coiled wiring 21 is formed by through holes 21c and printed wires 21d and 21e. The printed wires 21d indicated by solid lines in FIG. 4(a) are printed wires formed on the surface of the printed circuit board 2, and the printed wires 21e indicated by broken lines are printed wires formed on the back surface of the substrate 20. A printed wire 21d and a printed wire 21e are connected by a through hole 21c, and each printed wire 21d is connected to two adjacent printed wires 21e, whereby coiled printed wiring is formed. In FIG. 4(b), the surface of the printed circuit board 2 (substrate 20) is shown on the upper side of the drawing, and the back surface of the printed circuit board 2 is shown on the lower side of the drawing. The through holes 21c indicated by solid lines in FIG. 4(b) are through holes positioned on the cutting plane (or in other words, the through holes on the lower side of FIG. 4(a), which are positioned toward the penetration hole 29), and the through holes 21c indicated by broken lines are through holes invisible in the cross-sectional view (or in other words, the through holes on the upper side of FIG. 4(a), which are positioned opposite to the penetration hole 29).

The inner conductor 8 is disposed so as to extend along the penetration hole 29 of the printed circuit board 2 (see FIGS. 1 and 2), and thus the coiled wiring 21 functions as a current transformer disposed so as to surround the inner conductor 8.

Specifically, a magnetic flux generated by the high frequency current flowing through the inner conductor 8 acts on the coiled wiring 21, and thereby a current flows through the coiled wiring 21. Accordingly, a current corresponding to the high frequency current flowing through the inner conductor 8 can be detected by detecting the current flowing through the coiled wiring 21.

The coiled wiring 21 is composed of the through holes 21c and the printed wires 21d and 21e formed in the printed circuit board 2, and thus can be formed in a desired shape at a desired location. Accordingly, even when a plurality of printed circuit boards 2 are produced, little variation will occur in the spiral pitch and spiral strength of the coiled wiring 21, and therefore variations in the detected current values due to the multiple printed circuit boards 2 can be reduced. Also, the coiled wiring 21 is formed on the printed circuit board 2 and thus is easy to handle. Accordingly, the coiled wiring 21 can be properly disposed at a predetermined position by disposing the printed circuit board 2 at a predetermined position. The substrate 20 can be made of, for example, an insulating material such as glass epoxy. Such an insulating material has a relative permeability less than that of a magnetic material. For this reason, the self-resonant frequency can be increased as compared to the conventional configuration in which a current transformer is formed by winding a wire around a magnetic material used as a core. Accordingly, the upper limit of detectable frequency band for high frequency current can be raised.

The configuration of the coiled wiring 21 is not limited to that described above. It is also possible to, for example, form all or part of the coiled wiring 21 within a multi-layer structure substrate serving as a printed circuit board 2 by causing through holes 21c to partially pass through the multi-layer structure substrate and forming printed wires 21d or printed wires 21e between layers. Also, a plurality of current transformers may be provided by forming two sets or more of coiled wiring 21. For example, in FIG. 3, another coiled wiring may be formed between the coiled wiring 21 and the penetration hole 29. Alternatively, a double helix structure may be used by using two sets of coiled wiring by forming another coiled wiring 21 between wires of the coiled wiring 21. In this case, the multiple sets of coiled wiring may be connected in series or in parallel.

Reverting to FIG. 3, the ring connection wire 22 is a printed wire for electrically connecting the capacitance conductor 23 to the voltage conversion circuit 27. One end of the ring connection wire 22 is connected to the capacitance conductor 23, and the other end is connected to the voltage conversion circuit 27 in the circuit mounting portion 25. The capacitance conductor 23 and the voltage conversion circuit 27 are thereby electrically connected. The shape of the ring connection wire 22 is not limited to that shown in FIG. 3 and can be any shape as long as it can electrically connect the capacitance conductor 23 and the voltage conversion circuit 27.

The capacitance conductor 23 functions as one of capacitor electrodes. The capacitance conductor 23 can be made of, for example, copper. As shown in FIG. 2, the capacitance conductor 23 is composed of a cylinder portion 23a and flange portions 23b horizontally projecting from the outer surface of the cylinder portion. In the example shown in FIG. 2, each flange portion 23b is provided between upper and lower ends of the cylinder portion 23a. The shape and material of the capacitance conductor 23 are not limited to those described above. For example, the flange portion 23b may be formed at either end of the cylinder portion 23a and may be made of aluminum or the like. Also, the shape of the capacitance conductor 23 is not limited to a closed ring shape, and can have any shape as long as it can allow the inner conductor 8 to pass therethrough. The shape may be, for example, a C shape formed by removing a part from a closed ring, or a polygonal ring rather than a circular ring.

The outer diameter of the cylinder portion 23a of the capacitance conductor 23 is less than or equal to the inner diameter of the penetration hole 29 (see FIG. 3) of the printed circuit board 2, and thus the cylinder portion 23a is inserted into the penetration hole 29 and the flange portions 23b are fixed to the surface of the printed circuit board 2. In the present embodiment, a screw hole provided in each flange portion 23b and a screw hole provided in the printed circuit board 2 are fixed with a screw, but the fixing method is not limited thereto. The flange portions 23b are electrically connected to the ring connection wire 22.

The inner conductor 8 is disposed so as to pass through the penetration hole 29 of the printed circuit board 2 (see FIGS. 1 and 2), and thus the inner surface portion of the cylinder portion 23a of the capacitance conductor 23 functions as a capacitor electrode paired with a place within the inner conductor 8 that is opposed to the capacitance conductor 23. In other words, a voltage according to the high frequency voltage generated in the inner conductor 8 can be detected.

The ground wiring 24 is printed wiring serving as a reference (ground) potential, and is formed in an outer portion of each mounting surface of the substrate 20. The ground wiring 24 has a doughnut shape from which a portion corresponding to the circuit mounting portion 25 has been removed, and shares the same center with the substrate 20 and the penetration hole 29. The shape of the ground wiring 24 is not limited thereto. The ground wiring 24 is electrically connected to the outer conductor 9 via the fastener 4 made of a conductor (see FIGS. 1 and 2), and thus the potential of the ground wiring 24 serves as a reference (ground) potential.

The circuit mounting portion 25 is a place in which the current conversion circuit 26 and the voltage conversion circuit 27 are mounted, and is a part of the outer portion of each mounting surface of the printed circuit board 2 (the portion in which the ground wiring 24 is not formed). In the circuit mounting portion 25, the current conversion circuit 26 and the voltage conversion circuit 27 are mounted, the current conversion circuit 26 and the output wires 21a and 21a' are connected, and the voltage conversion circuit 27 and the ring connection wire 22 are connected.

The current conversion circuit 26 converts the current input by the coiled wiring 21 to a high frequency current signal, which is a predetermined voltage level signal, and outputs the signal. The current conversion circuit 26 is disposed in the circuit mounting portion 25, and is connected to the output wires 21a and 21a' in the circuit mounting portion 25. Although not illustrated in FIG. 3, an output wire for outputting the high frequency current signal is connected to the current conversion circuit 26. The output wire extends through an opening (not shown) provided in the outer conductor 9 to the outside of the outer conductor 9, and is connected to the computing unit (see FIG. 12). The present embodiment illustrates an example in which the current conversion circuit 26 is mounted as a single electronic component, but the current conversion circuit 26 may be composed of a plurality of electronic components. In this case, the electronic components may be mounted in the circuit mounting portion 25, and the electronic components may be connected with printed wiring.

The voltage conversion circuit 27 converts the voltage input by the capacitance conductor 23 to a high frequency voltage signal, which is a predetermined voltage level signal, and outputs the signal. The voltage conversion circuit 27 is disposed in the circuit mounting portion 25, and is connected to the ring connection wire 22 in the circuit mounting portion 25.

Figure 5:
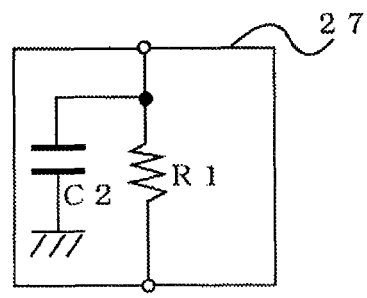
FIG. 5 is a diagram illustrating an example of the internal configuration of a voltage conversion circuit.

FIG. 5 is a diagram illustrating an example of the internal configuration of the voltage conversion circuit 27.

The voltage conversion circuit 27 includes a capacitor C2 connected in series to the capacitance conductor 23 via the ring connection wire 22 (see FIG. 3) and a resistor R1 connected to a connection point between the capacitance conductor 23 and the capacitor C2. The high frequency voltage generated in the inner conductor 8 is divided by the capacitor C2 and a capacitor (hereinafter also referred to as the "capacitor C1" depending on the case) formed between the capacitance conductor 23 and the inner conductor 8. The voltage level of the divided voltage generated in the capacitance conductor 23 is adjusted by the resistor R1, and output as a high frequency voltage signal.

The computing unit usually includes a voltage follower circuit (whose input impedance is high) provided at an input terminal thereof, and thus hardly any current flows to the resistor R1 for adjustment. A current may, of course, flow depending on the design of the computing unit. For example, in the case where a resistor is provided at an input terminal of the computing unit between the input terminal of the computing unit and the ground potential, some current flows to the resistor R1 as well. Accordingly, adjustment by the resistor R1 becomes possible. As can be seen from the above description, it is sufficient if a voltage divider circuit is configured with the capacitor C1 and the capacitor C2. Accordingly, the resistor R1 for adjustment may be omitted if unnecessary. In other words, because the capacitor C1 is formed by the capacitance conductor 23 and the like, it is sufficient if the voltage conversion circuit 27 includes at least the capacitor C2.

It is also possible to configure a voltage divider circuit by using a voltage divider resistor instead of the capacitor C2 of the voltage conversion circuit 27. The capacitor C2 and the voltage divider resistor serve as voltage divider elements. The voltage divider elements such as the capacitor C2 and the voltage divider resistor may be composed of a single element, or may be composed of a plurality of elements. It is also possible to combine a capacitor and a resistor. As described above, it is of course necessary to design the electrostatic capacity of the capacitor C1 and the resistance value of the voltage divider resistor taking the attenuation factor and the combined into consideration.

Although not illustrated in FIG. 3, an output wire for outputting the high frequency current signal is connected to the voltage conversion circuit 27. The output wire extends through the opening (not shown) provided in the outer conductor 9 to the outside of the outer conductor 9, and is connected to the computing unit (see FIG. 12). The present embodiment illustrates an example in which the voltage conversion circuit 27 is mounted as a single electronic component, but the voltage conversion circuit 27 may be composed of a plurality of electronic components. In this case, the electronic components may be mounted in the circuit mounting portion 25, and the electronic components may be connected with printed wiring.

The current conversion circuit 26 and the voltage conversion circuit 27, or the electronic components that constitute these circuits may be mounted in the circuit mounting portion 25 of one of the mounting surfaces of the printed circuit board 2, or may be mounted in the circuit mounting portions 25 of both mounting surfaces of the printed circuit board 2. In the case where they are mounted in the circuit mounting portions 25 of both mounting surfaces, they can be connected with printed wiring via through holes.

The current conversion circuit 26 and the voltage conversion circuit 27 may be provided separately rather than being provided on the printed circuit board 2. In this case, the following configuration can be used: output terminals are provided at ends of the output wires 21a and 21a'; the output terminals and the current conversion circuit 26 are connected with connection wiring; an output terminal is provided at an end of the ring connection wire 22; and the output terminal and the voltage conversion circuit 27 are connected with connection wiring.

Reverting to FIGS. 1 and 2, the fastener 4 fixes the printed circuit board 2 inside the outer conductor 9. The fastener 4 is a conductor, which is firmly fixed onto the ground wiring 24 (see FIG. 3) of the printed circuit board 2 so as to establish an electrical connection and is fixed to the outer conductor 9 so as to establish an electrical connection. The ground wiring 24 and the outer conductor 9 are thereby electrically connected, and the potential of the ground wiring 24 serves as a reference (ground) potential. In the present embodiment, as the fastener 4, four attachment blocks are firmly fixed to the printed circuit board 2, and screw holes (not shown) provided in the attachment blocks and the outer conductor 9 are fixed using screws (not shown). The method for attaching the fastener 4 is not limited thereto, and any method can be used as long as the printed circuit board 2 can be fixed inside the outer conductor 9. It is possible to, for example, weld the fastener 4 to the outer conductor 9 or bond the fastener 4 to the outer conductor 9 with an adhesive. It is also possible to fix the printed circuit board 2 directly to the outer conductor 9 without using the fastener 4. Also, the ground wiring 24 and the outer conductor 9 may be electrically connected by another method.

The protective substrate 5 protects the wiring on the printed circuit board 2 and the mounted electronic circuits from electromagnetic waves generated by the high frequency power transmitted through the inner conductor 8. As the protective substrate 5, a substrate similar to the substrate 20 (see FIG. 3) of the printed circuit board 2 (a circular substrate having a penetration hole formed therein) in which ground wiring has been formed over one mounting surface (or both mounting surfaces) is used, and two protective substrates 5 are disposed so as to sandwich the printed circuit board 2 in the axial direction of the inner conductor 8. In the present embodiment, in order to suppress the occurrence of stray capacity by the protective substrate 5 and the capacitance conductor 23, the inner diameter of the penetration hole of the protective substrate 5 is set approximately the same as the outer diameter of the capacitance conductor 23 so as to not create an overlapping portion between the protective substrate 5 and the capacitance conductor 23 as viewed in the axial direction of the inner conductor 8. The size and shape of the penetration hole of the protective substrate 5 are not limited to those described above. The size and shape of the protective substrate 5 are also not limited to those described above.

The protective substrate 5 is fixed to the printed circuit board 2 by the fastener 6, which will be described later. The protective substrate 5 is fixed with the fastener 6 made of a conductor so as to electrically connect the ground wiring of the protective substrate 5 and the ground wiring 24 (see FIG. 3) of the printed circuit board 2, and thus the potential of the ground wiring of the protective substrate 5 serves as a reference (ground) potential. The protective substrate 5 may be omitted if the influence of the electromagnetic waves generated from the inner conductor 8 on the wiring and the electronic circuits is small.

The fastener 6 fixes the protective substrate 5 to the printed circuit board 2. The fastener 6 is a conductor, and fixes the protective substrate 5 to the printed circuit board 2 so as to electrically connect the ground wiring 24 (see FIG. 3) of the printed circuit board 2 and the ground wiring of the protective substrate 5. The ground wiring of the protective substrate 5 and the ground wiring 24 are thereby electrically connected, and the potential of the ground wiring of the protective substrate 5 serves as a reference (ground) potential. In the present embodiment, as the fastener 6, four metal spacers are used to fix the protective substrate 5 in parallel to the printed circuit board 2. In FIG. 1, the protective substrate 5 and the fastener 6 are not illustrated. The method for attaching the fastener 6 is not limited thereto, and any method can be used as long as the protective substrate 5 can be fixed to the printed circuit board 2. It is possible to, for example, bond the fastener 6 to the protective substrate 5 and the printed circuit board 2 with an adhesive. It is also possible to fix the protective substrate 5 inside the outer conductor 9 in the same manner as the printed circuit board 2 is fixed with the fastener 4. It is also possible to fix the protective substrate 5 directly to the outer conductor 9. The ground wiring of the protective substrate 5 and the ground wiring 24 of the printed circuit board 2 may be electrically connected by another method.

Figure 6:
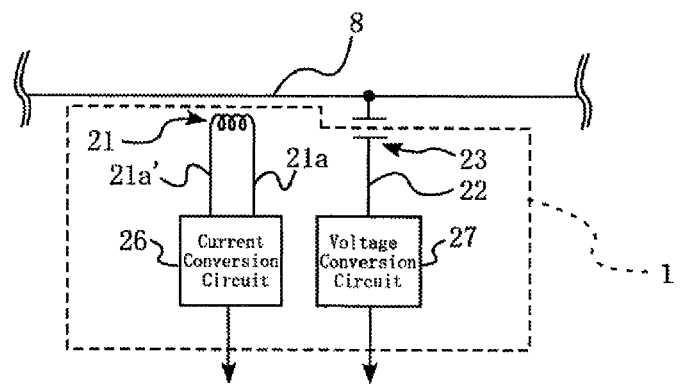
FIG. 6 is a circuit diagram showing the internal configuration of the high frequency detection device.

FIG. 6 is a circuit diagram showing the internal configuration of the high frequency detection device 1.

As shown in FIG. 6, the coiled wiring 21 functions as a current transformer that detects a current according to the high frequency current flowing through the inner conductor 8, and the capacitance conductor 23 functions as one of the electrodes of the capacitor that detects a voltage according to the high frequency voltage generated in the inner conductor 8. The current detected by the coiled wiring 21 is input into the current conversion circuit 26 via the output wires 21a and 21a'. The current conversion circuit 26 converts the input current to a high frequency current signal, which is a predetermined voltage level signal, and outputs the signal. The voltage detected by the capacitance conductor 23 is input into the voltage conversion circuit 27 via the ring connection wire 22. The voltage conversion circuit 27 converts the input voltage to a high frequency voltage signal, which is a predetermined voltage level signal, and outputs the signal.

In the present embodiment, the height (the vertical length in FIG. 2) of the cylinder portion 23a of the capacitance conductor 23 can be made greater than the thickness (the vertical length in FIG. 2) of the printed circuit board 2. Accordingly, the capacity of the capacitor using the capacitance conductor 23 as an electrode can be increased as compared to that of a capacitor in which ring-shaped wiring is formed on a printed circuit board 2 in the form of printed wiring and this is used as an electrode. Accordingly, the electrostatic capacity of the capacitor formed between the capacitance conductor 23 and the inner conductor 8 is not limited by the thickness of the printed circuit board 2. In other words, the height of the cylinder portion 23a of the capacitance conductor 23 may be made either greater or less than the thickness of the printed circuit board 2. By making the height of the cylinder portion 23a greater than the thickness of the printed circuit board 2, an electrostatic capacity which was not achieved by conventional technology can be obtained. As described above, a substrate can currently have a maximum thickness of approximately 5 mm, and thus a particularly useful effect can be obtained when the height of the cylinder portion 23a of the capacitance conductor 23 is 5 mm or greater.

Figure 15:
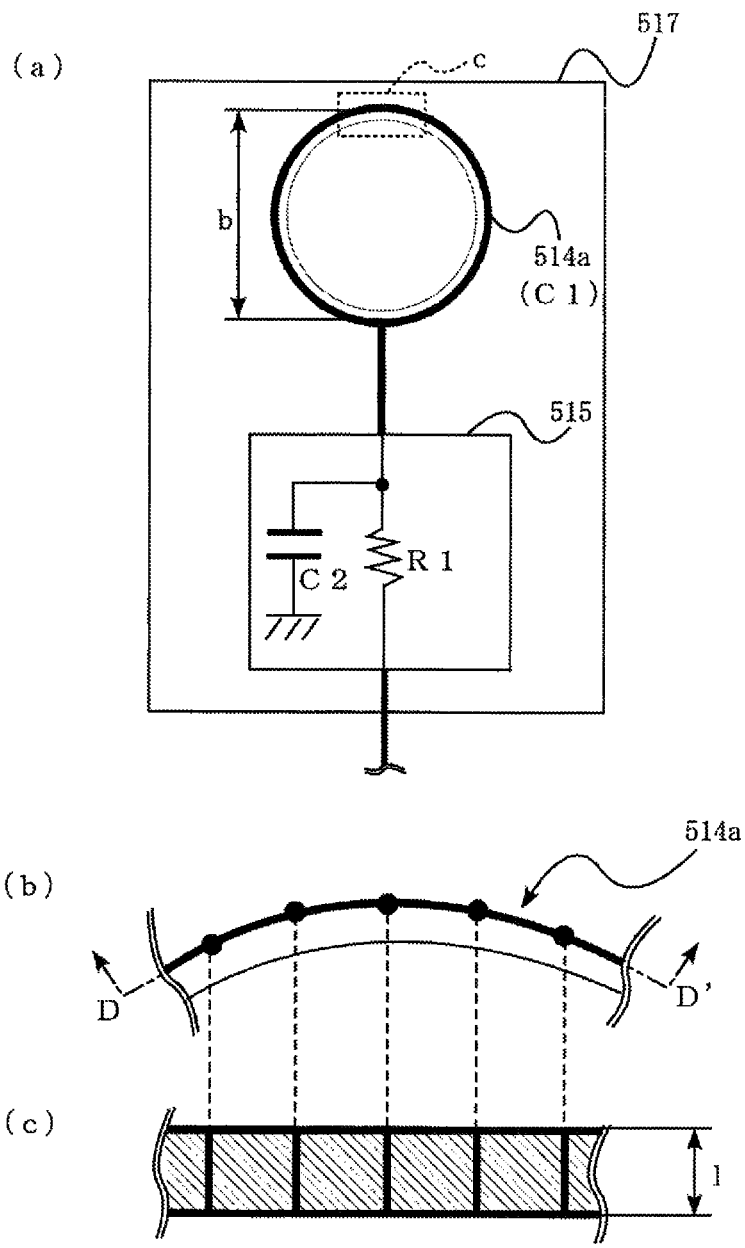
FIGS. 15(a) to 15(c) are diagrams illustrating an example of a voltage detection printed circuit board.

For example, in the conventional technique shown in FIG. 15, if it is assumed that the inner conductor 8 has an outer diameter a of 20 mm, the ring-shaped wiring 514a has an inner diameter b of 60 mm, and the voltage detection printed circuit board 517 has a thickness of 5 mm, from the Equation (1) given above, the electrostatic capacity of the capacity using the ring-shaped wiring 514a as an electrode will be 0.25 pF at most. On the other hand, even if the outer diameter a of the inner conductor 8, the inner diameter b of the capacitance conductor 23 and the thickness of the printed circuit board 2 are set to the same values, by setting the height of the cylinder portion 23a of the capacitance conductor 23 to 9.9 mm, the electrostatic capacity of the capacitor using the capacitance conductor 23 as an electrode will be 0.5 pF. The values used in the above example are merely examples, and the electrostatic capacity of the capacitor using the capacitance conductor 23 as an electrode is not limited thereto. For example, an appropriate value for the electrostatic capacity of the capacitor using the capacitance conductor 23 as an electrode can vary depending on the high frequency voltage generated in the inner conductor 8 and the frequency of the high frequency power output from the high frequency power source apparatus.

Also, the capacitance conductor 23 is easy to handle because it is fixed on the printed circuit board 2, and the capacitance conductor 23 can be properly disposed at a predetermined position by disposing the printed circuit board 2 at a predetermined position.

Furthermore, the printed circuit board 2 of the high frequency detection device 1 is fixed to the outer conductor 9, and the inner conductor 8 is coaxially fixed to the outer conductor 9 in the coaxial cable. Accordingly, the relative position of the coiled wiring 21 formed on the printed circuit board 2 or the capacitance conductor 23 fixed on the printed circuit board 2 with respect to the inner conductor 8 is fixed. Consequently, the situation in which the relative position of the coiled wiring 21 or the capacitance conductor 23 with respect to the inner conductor 8 changes or becomes unstable can be suppressed, and it is thereby possible to suppress the occurrence of variations in the detected values.

Also, the high frequency detection device 1 is disposed inside the outer conductor 9. Accordingly, it is unnecessary to prepare a space for disposing the high frequency detection device 1. Also, the high frequency detection device 1 can be disposed with a simple operation of, for example, forming screw holes for fixing the high frequency detection device 1 in the outer conductor 9 without requiring a modification such as dividing the outer conductor 9. Accordingly, the high frequency detection device 1 can be easily disposed in the transmission path.

Next, a high frequency detection device according to a second embodiment of the present invention will be described with reference to FIGS. 7 to 9.

In the case where the electric fields generated around the inner conductor 8 have a significant influence on the coiled wiring 21, it is necessary to reduce the influence of the electric fields. On the other hand, it is also necessary to cause the magnetic flux generated by the high frequency current flowing through the inner conductor 8 to act on the coiled wiring 21, and therefore the coiled wiring 21 cannot be completely shielded. Accordingly, it is necessary to provide a shielding portion that reduces the influence of the electric fields on the coiled wiring 21 while causing the magnetic flux to act on the coiled wiring 21. A high frequency detection device of the second embodiment includes such a shielding portion.

Figure 7:
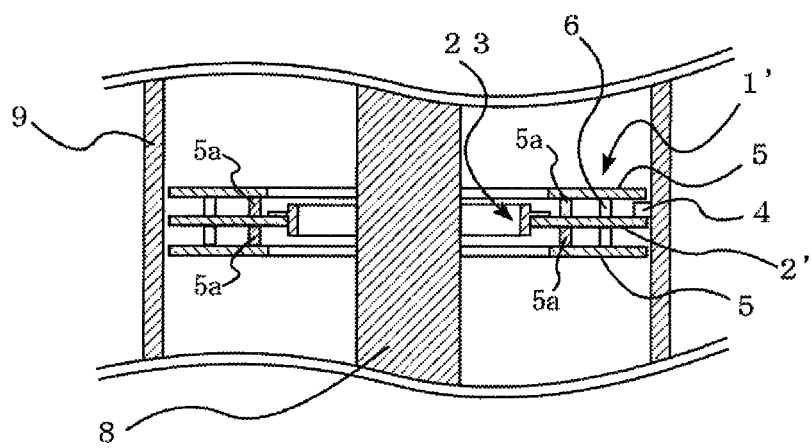
FIG. 7 is a diagram illustrating the configuration of a high frequency detection device according to a second embodiment of the present invention, showing the high frequency detection device disposed in a coaxial cable as viewed in the radial direction of the coaxial cable.
Figure 8:
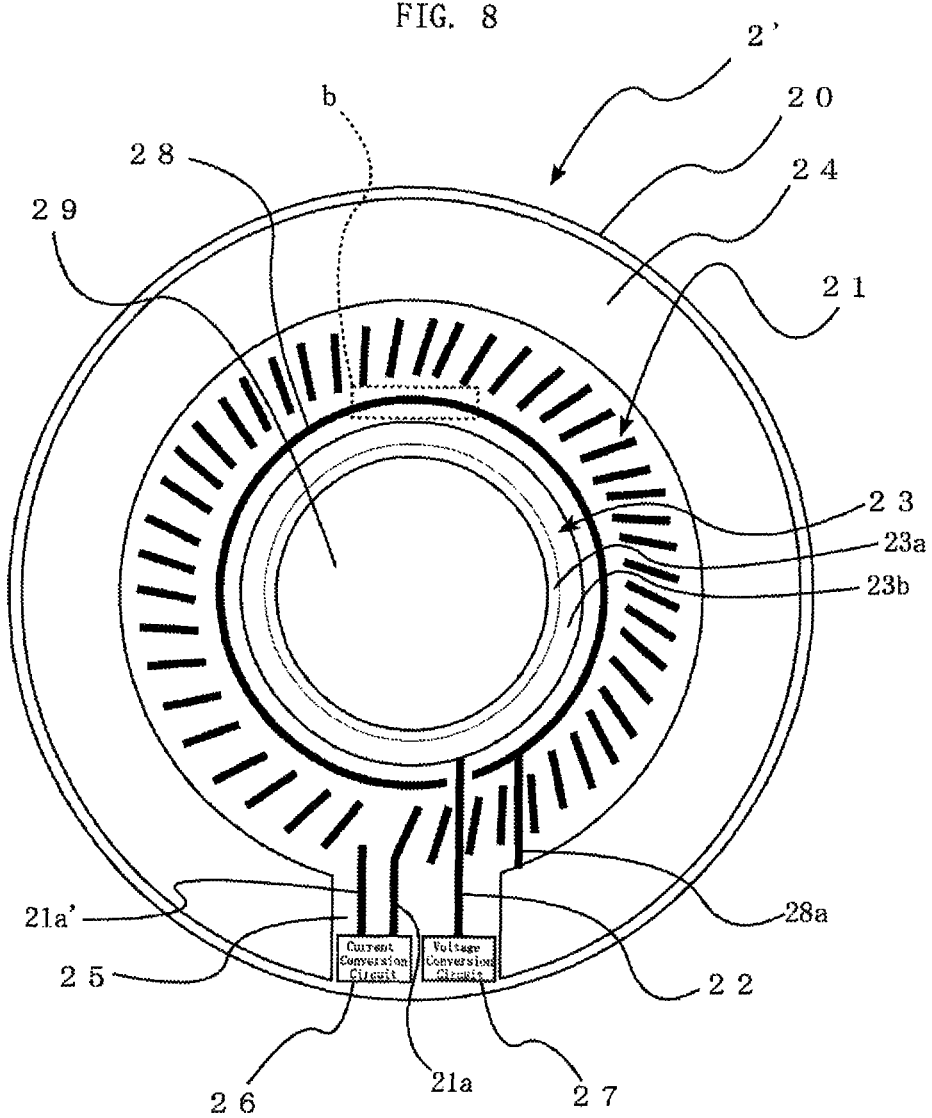
FIG. 8 is a plan view illustrating a printed circuit board according to the second embodiment.
Figure 9:
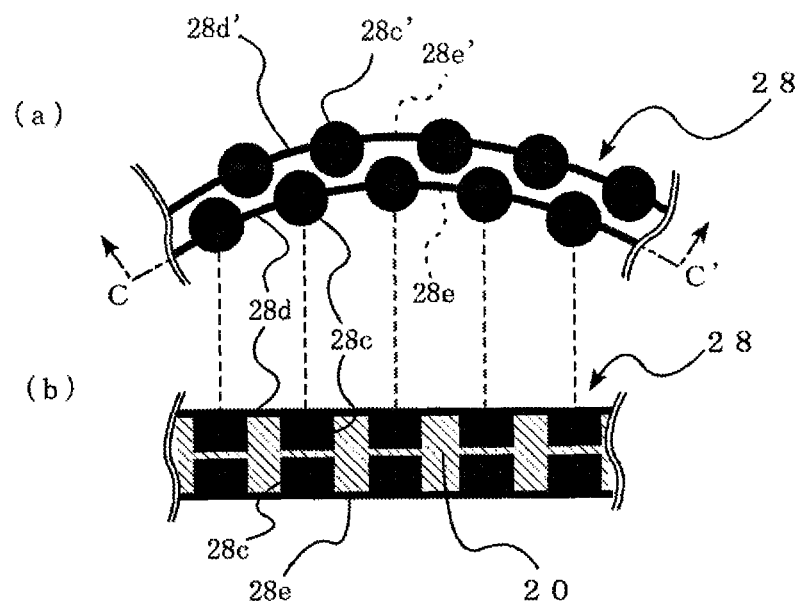
FIGS. 9(a) and 9(b) are diagrams illustrating shielding wiring.

FIGS. 7 to 9 are diagrams illustrating the configuration of a high frequency detection device 1' according to the second embodiment. FIG. 7 shows the high frequency detection device 1' disposed in a coaxial cable as viewed in the radial direction of the coaxial cable, which corresponds to FIG. 2 described above. A diagram of the high frequency detection device 1' disposed in the coaxial cable as viewed from the axial direction of the coaxial cable is the same as that shown in FIG. 1, and thus is not shown here. In FIG. 7, the same reference numerals are given to elements that are the same as or similar to those of the high frequency detection device 1 shown in FIG. 2. The high frequency detection device 1' shown in FIG. 7 is different from the high frequency detection device 1 shown in FIG. 2 in that a shielding portion 5a is provided on each protective substrate 5 and that a printed circuit board 2' has a different configuration.

The shielding portion 5a is an annular conductor provided on the face of the protective substrate 5 opposed to the printed circuit board 2'. The shielding portion 5a is provided so as to have a shape similar to that of shielding wiring 28 provided on the printed circuit board 2', and is configured such that the shielding portion 5a is connected to the shielding wiring 28 when the protective substrate 5 is fixed to the printed circuit board 2'. Also, the shielding portion 5a is provided on the ground wiring of the protective substrate 5 and is connected to the ground wiring. The coiled wiring 21 is surrounded by a shielding portion composed of the ground wiring and the shielding portion 5a of the protective substrate 5, the shielding wiring 28 of the printed circuit board 2' and the outer conductor 9.

FIG. 8 is a plan view illustrating the printed circuit board 2', which corresponds to FIG. 3 described above. In FIG. 8, the same reference numerals are given to elements that are the same as or similar to those of the printed circuit board 2 shown in FIG. 3. The printed circuit board 2' shown in FIG. 8 is different from the printed circuit board 2 shown in FIG. 3 in that it includes the shielding wiring 28.

The shielding wiring 28 is printed wiring formed between the coiled wiring 21 of the printed circuit board 2' and the capacitance conductor 23, and functions as a part of the shielding portion that shields the coiled wiring 21. A connection printed wire 28a extending to the ground wiring 24 is formed in the shielding wiring 28, and the shielding wiring 28 is connected to the ground wiring 24 via the connection printed wire 28a. In the case where the shielding wiring 28 is connected to the shielding portion 5a of the protective substrate 5, the shielding wiring 28 is connected to the ground via the shielding portion 5a, the protective substrate 5, the fastener 6 and the ground wiring 24 of the printed circuit board 2'. For this reason, the connection printed wire 28a may be omitted.

FIGS. 9(a) and 9(b) are diagrams illustrating the shielding wiring 28. FIG. 9(a) is an enlarged view of a region surrounded by a broken line and indicated by b in FIG. 8, and FIG. 9(b) is a cross-sectional view taken along the line C-C' in FIG. 9(a).

As shown in FIGS. 9(a) and 9(b), the shielding wiring 28 is formed by through holes 28c and 28c' and printed wires 28d, 28d', 28e and 28e'. The through holes 28c, 28c' shown in FIGS. 9(a) and 9(b) are of a type, called interstitial via hole, in which the through holes are formed only between particular layers. The printed wires 28d, 28d' shown in FIG. 9(a) are printed wires formed on the surface of the printed circuit board 2'. The printed wires 28e and 28e' not shown in FIG. 9(a) are formed on the back surface of the substrate 20 (see FIG. 9(b)). The printed wires 28e and 28e' are disposed at positions opposed to the printed wires 28d and 28d', and thus in FIG. 9(a), the reference numerals are given with broken drawn out lines. In FIG. 9(b), the surface of the printed circuit board 2' (substrate 20) is shown on the upper side of the drawing, and the back surface of the printed circuit board 2' is shown on the lower side of the drawing. The through holes 28c formed in the surface of the substrate 20 are connected by the printed wires 28d formed on the surface, and the through holes 28c formed on the back surface of the substrate 20 are connected by the printed wires 28e formed on the back surface. The through holes 28c' formed in the surface of the substrate 20 are connected by the printed wires 28d' formed on the surface, and the through holes 28c' formed on the back surface of the substrate 20 are connected by the printed wires 28e' formed on the back surface. The through holes 28c and 28c' are connected by the shielding portion 5a of the protective substrate 5 shown in FIG. 7, and thus the printed wires 28d, 28d', 28e and 28e' may be omitted. In FIG. 8, the shielding wiring 28 is provided to substantially surround the penetration hole 29 except for a portion corresponding to the ring connection wire 22.

As shown in FIGS. 9(a) and 9(b), the shielding wiring 28 is formed by two rows, or in other words, the through holes 28c are formed on the capacitance conductor 23 side and the through holes 28c' are formed on the coiled wiring 21 side. The through holes 28c and the through holes 28c' are disposed so as to be offset from each other such that there is no gap therebetween (a through hole 28c' is positioned between adjacent through holes 28c in FIG. 9(b)) as viewed from the penetration hole 29. It is thereby possible to reduce the influence of the electric fields generated around the inner conductor 8 disposed in the penetration hole 29 of the printed circuit board 2'. Also, there is an unshielded gap between the through holes 28c and 28c on the surface side of the printed circuit board 2' (substrate 20) and the through holes 28c and 28c' on the back surface side of the printed circuit board 2', and it is thus possible to cause the magnetic flux generated by the high frequency current flowing through the inner conductor 8 to act on the coiled wiring 21.

The configuration of the shielding wiring 28 is not limited to that described above. It is possible to, for example, dispose through holes in three or more rows. Also, it is sufficient if the shielding wiring 28 is formed between the coiled wiring 21 and the capacitance conductor 23, and thus the shape is not limited to a circular shape. The shielding portion 5a of the protective substrate 5 can be formed to conform to the shape of the shielding wiring 28. Also, the through holes 28c and 28c' may be formed as a type of through hole that passes from the surface of the substrate 20 to the back surface so as to provide an unshielded gap between the shielding portion 5a of the protective substrate 5 and the through holes 28c and 28c'.

The shielding portion composed of the ground wiring and the shielding portion 5a of the protective substrate 5, the shielding wiring 28 of the printed circuit board 2' and the outer conductor 9 shields the coiled wiring 21 disposed therein from the electric fields generated around the inner conductor 8, and thus the influence of the electric fields on the coiled wiring 21 can be reduced. The shielding portion includes an unshielded gap (the gap between the through holes 28c and 28c' on the surface side of the shielding wiring 28 and the through holes 28c and 28c' on the back surface side in the example shown in FIGS. 9(a) and 9(b)), and it is thus possible to cause the magnetic flux generated by the high frequency current flowing through the inner conductor 8 to act on the coiled wiring 21.

Figure 10:
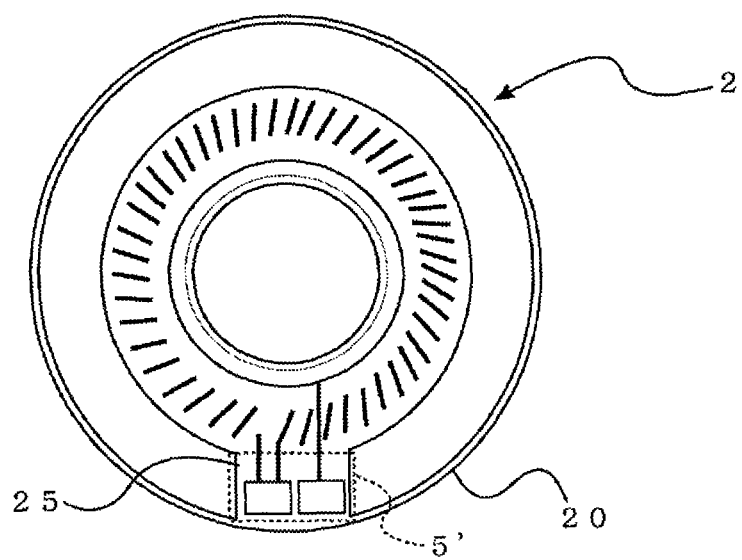
FIG. 10 is a diagram illustrating a protective case disposed instead of a protective substrate.

The first embodiment has been described taking an example in which the protective substrate 5 has the same size as that of the printed circuit board 2, but the configuration is not limited thereto. In the case where the influence of the electromagnetic waves on the printed wiring is small, only the electronic circuits mounted on the printed circuit board 2 can be protected. In this case, it is unnecessary to cover the coiled wiring 21 with the protective substrate 5, and the protective substrate 5 may be made in a size that can cover the circuit mounting portion 25. Also, instead of disposing the protective substrate 5, a protective case 5' indicated by a broken line in FIG. 10 may be disposed so as to cover only the circuit mounting portion 25.

The first and second embodiments given above have been described taking an example in which the high frequency detection device 1 or 1' detects both a high frequency voltage signal and a high frequency current signal, but the present invention is not limited thereto. The present invention is also applicable to a high frequency detection device that detects only a high frequency voltage signal. In the case where the present invention is applied to a high frequency detection device that detects only a high frequency voltage signal, it is unnecessary to provide the coiled wiring 21 and the current conversion circuit 26 in the printed circuit board 2 shown in FIG. 3. Also, in this case, the penetration hole 29 in the printed circuit board 2 may be omitted. For example, a cutout portion may be formed in the printed circuit board 2, and the capacitance conductor 23 may be fixed to the cutout portion. It is also possible to fix the capacitance conductor 23 to the outer edge of the printed circuit board 2.

Also, the present invention is not limited to the configuration in which the capacitance conductor 23 for detecting a high frequency voltage signal and the voltage conversion circuit 27, and the coiled wiring 21 for detecting a high frequency current signal and the current conversion circuit 26 are formed in a single printed circuit board 2. The present invention is also applicable to a configuration in which a printed circuit board having the capacitance conductor 23 and the voltage conversion circuit 27 formed thereon and a printed circuit board having the coiled wiring 21 and the current conversion circuit 26 formed thereon are fixed to the outer conductor 9.

The first and second embodiments given above have been described taking an example in which the high frequency detection device 1 or 1' is fixed inside the outer conductor 9, but the present invention is not limited thereto. It is possible to, for example, fix the printed circuit board 2 or 2' to a housing and fix the housing inside the outer conductor 9. The housing may be fixed to an insulator covering the inner conductor 8. In either case, the effect that the electrostatic capacity of the capacitor formed between the capacitance conductor 23 and the inner conductor 8 is not limited by the thickness of the printed circuit board 2 or 2' can be obtained.

Figure 11:
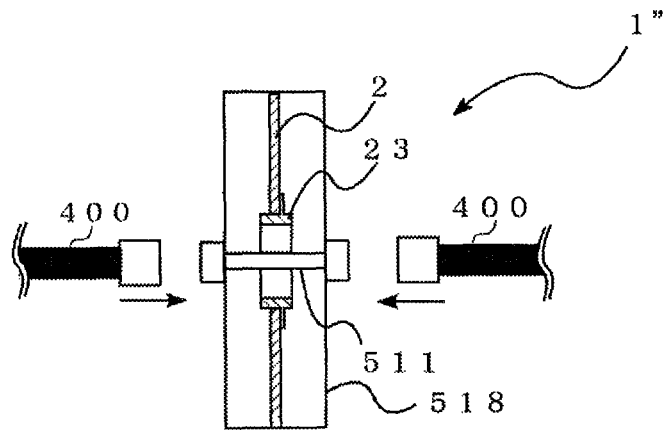
FIG. 11 is a diagram illustrating the configuration of a high frequency detection device according to a third embodiment of the present invention.
Figure 14:
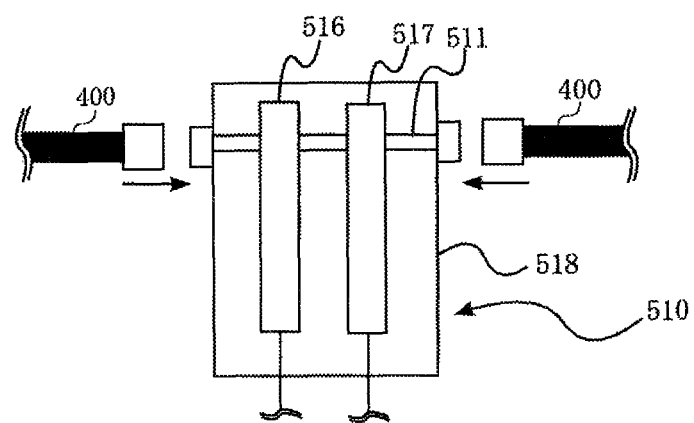
FIG. 14 is a diagram illustrating the configuration of a conventional high frequency detection device.

In the case where the housing is fixed to, instead of the inner conductor 8, a power transmission body covered with an insulator, a coaxial cable may be connected to each end of the power transmission body with a connector. FIG. 11 is a diagram illustrating a high frequency detection device 1'' according to a third embodiment of the present invention in which the printed circuit board 2 is used instead of the current detection printed circuit board 516 and the voltage detection printed circuit board 517 in the conventional high frequency detection device 510 shown in FIG. 14.

As shown in FIG. 11, the high frequency detection device 1'' includes the printed circuit board 2 (including the capacitance conductor 23 and so on), the power transmission body 511 and the housing 518. The printed circuit board 2 is fixed to the housing 518, and the housing 518 is fixed to the insulator covering the power transmission body 511. The high frequency detection device 1'' can be connected partway along a coaxial cable 400 by connecting connectors provided at both ends of the power transmission body 511 to connectors provided at ends of the coaxial cable 400.

In this embodiment as well, the effect that the electrostatic capacity of the capacitor formed between the capacitance conductor 23 and the power transmission body 511 is not limited by the thickness of the printed circuit board 2 can be obtained.

The high frequency detection device of the present invention and the coaxial cable including the same are not limited to the embodiments given above. Also, the specific configurations of the constituent elements of the high frequency detection device of the present invention and the coaxial cable including the same can be designed and changed in various ways.

The invention claimed is:

1. A high frequency detection device that detects a high frequency voltage signal according to a high frequency voltage generated in a power transmission body, the apparatus comprising:
 a substrate in which is formed a penetration hole that is capable of accepting a power transmission body; and
 a capacitance conductor that is fixed to the substrate and includes a penetration portion and a capacitor electrode, the capacitor electrode configured to be opposed to the power transmission body when the power transmission body extends through the penetration hole in a state in which an axial direction of the power transmission body and the substrate are substantially orthogonal;
 wherein the capacitor electrode is inserted within the penetration hole and the penetration portion engages the substrate.

2. The high frequency detection device according to claim 1, further comprising a voltage converter including a voltage divider element connected in series to the capacitance conductor,
 wherein the voltage converter is configured to output a high frequency voltage signal obtained by attenuating the high frequency voltage generated in the power transmission body to a predetermined voltage level.

3. The high frequency detection device according to claim 2, wherein the voltage divider element includes a capacitor or a resistor.

4. The high frequency detection device according to claim 1, wherein the capacitance conductor has a ring shape.

5. The high frequency detection device according to claim 1, further comprising coiled wiring and a current converter,
 wherein the coiled wiring is formed along a perimeter of the capacitance conductor on the substrate, and the current converter is configured to output a high frequency current signal, which is a predetermined voltage level signal, based on a current flowing through the coiled wiring according to a high frequency current flowing through the power transmission body disposed so as to pass through the capacitance conductor.

6. The high frequency detection device according to claim 5, further comprising a shielding portion provided between the coiled wiring and the capacitance conductor on the substrate,
 wherein the shielding portion is configured to reduce an influence of an electric field generated around the power transmission body on the coiled wiring while causing a magnetic flux generated by the current flowing through the power transmission body to act on the coiled wiring.

7. The high frequency detection device according to claim 1 used in a coaxial cable including an inner conductor and an outer conductor, wherein the power transmission body is the inner conductor, and the substrate is fixed inside the outer conductor.

8. The high frequency detection device according to claim 7, wherein the substrate has a circular shape.

9. The high frequency detection device according to claim 7, further comprising a protector for protecting wiring on the substrate or a circuit mounted on the substrate from an electromagnetic wave generated by high frequency power transmitted through the power transmission body.

10. The high frequency detection device according to claim 9, wherein the protector comprises two protective substrates provided so as to sandwich the substrate in the axial direction of the power transmission body.

11. A coaxial cable comprising:
 an elongated inner power transmission body;
 an outer conductor surrounding the inner power transmission body; and
 a high frequency detection device that detects a high frequency voltage signal according to a high frequency voltage generated in the inner power transmission body,
 wherein the high frequency detection device comprises a substrate in which is formed a penetration hole that accepts the inner power transmission body, the substrate being fixed inside the outer conductor and a capacitance conductor that is fixed to the substrate and comprises a capacitor electrode and a penetration portion that engages the substrate,
 the capacitor electrode is configured to be opposed to the inner power transmission body when the inner power transmission body extends through the penetration hole in a state in which an axial direction of the inner power transmission body and the substrate are substantially orthogonal, and
 wherein the capacitor electrode is inserted within the penetration hole.

12. The high frequency detection device according to claim 1, wherein the capacitance conductor comprises an outwardly-extending flange fixed to a surface of the substrate.

13. The coaxial cable according to claim 11, wherein the capacitance conductor comprises an outwardly-extending flange fixed to a surface of the substrate.

* * * * *